(12) United States Patent
Rae et al.

(10) Patent No.: US 10,163,687 B2
(45) Date of Patent: Dec. 25, 2018

(54) SYSTEM, APPARATUS, AND METHOD FOR EMBEDDING A 3D COMPONENT WITH AN INTERCONNECT STRUCTURE

(71) Applicant: QUALCOMM Incorporated, San Diego, CA (US)

(72) Inventors: David Fraser Rae, San Diego, CA (US); Lizabeth Ann Keser, San Diego, CA (US); Reynante Tamunan Alvarado, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 44 days.

(21) Appl. No.: 14/861,484

(22) Filed: Sep. 22, 2015

(65) Prior Publication Data

US 2016/0343651 A1   Nov. 24, 2016

Related U.S. Application Data

(60) Provisional application No. 62/165,820, filed on May 22, 2015.

(51) Int. Cl.
*H01L 21/56* (2006.01)
*H01L 23/00* (2006.01)
(Continued)

(52) U.S. Cl.
CPC .......... *H01L 21/768* (2013.01); *H01L 21/563* (2013.01); *H01L 23/3128* (2013.01); *H01L 23/5384* (2013.01); *H01L 23/5385* (2013.01); *H01L 23/5389* (2013.01); *H01L 24/19* (2013.01); *H01L 24/20* (2013.01); *H01L 24/96* (2013.01); *H01L 24/97* (2013.01); *H01L 25/16* (2013.01); *H01L 21/561* (2013.01); *H01L 21/568* (2013.01); *H01L 23/49816* (2013.01); *H01L 2224/04105* (2013.01); *H01L 2224/12105* (2013.01); *H01L 2224/16227* (2013.01); *H01L 2224/16245* (2013.01);
(Continued)

(58) Field of Classification Search
CPC ....... H01L 25/12; H01L 25/16; H01L 25/162; H01L 28/10; H01L 28/20; H01L 28/40; H01L 2924/1904; H01L 2924/19041; H01L 2924/19042; H01L 2924/19043; H01L 2924/19105
See application file for complete search history.

(56) References Cited

U.S. PATENT DOCUMENTS 5,031,072 A * 7/1991 Malhi ..................... H01L 23/13
257/723
5,161,009 A * 11/1992 Tanoi .................. H01L 23/4985
257/668
(Continued)

OTHER PUBLICATIONS

International Search Report and Written Opinion—PCT/US2016/033261—ISA/EPO—dated Aug. 24, 2016.

*Primary Examiner* — David A Zarneke
(74) *Attorney, Agent, or Firm* — Muncy, Geissler, Olds & Lowe, P.C./Qualcomm (57) ABSTRACT

A package may include a die proximate to a structure having a substrate with interconnects and a first component coupled to the interconnects. The die may be face up or face down. The package may include a first redistribution layer coupling the die to the interconnects of the structure and a mold compound covering the die and maybe the structure.

10 Claims, 9 Drawing Sheets

(51) Int. Cl.
*H01L 23/31* (2006.01)
*H01L 25/16* (2006.01)
*H01L 21/768* (2006.01)
*H01L 23/498* (2006.01)
*H01L 23/538* (2006.01)
*H01L 21/00* (2006.01)

(52) U.S. Cl.
CPC ......... *H01L 2224/24137* (2013.01); *H01L 2224/24195* (2013.01); *H01L 2224/32225* (2013.01); *H01L 2224/73204* (2013.01); *H01L 2224/97* (2013.01); *H01L 2225/1035* (2013.01); *H01L 2225/1041* (2013.01); *H01L 2924/14* (2013.01); *H01L 2924/1431* (2013.01); *H01L 2924/1434* (2013.01); *H01L 2924/18162* (2013.01); *H01L 2924/19041* (2013.01); *H01L 2924/19042* (2013.01); *H01L 2924/19105* (2013.01); *H01L 2924/37001* (2013.01)

(56) References Cited

U.S. PATENT DOCUMENTS

| | | | | |
|---|---|---|---|---|
| 5,397,747 A * | 3/1995 | Angiulli | H01L 25/0652 | 228/180.22 |
| 5,530,623 A * | 6/1996 | Sanwo | H05K 1/14 | 361/784 |
| 5,545,924 A * | 8/1996 | Contolatis | H01L 23/66 | 257/724 |
| 5,625,734 A * | 4/1997 | Thomas | G02B 6/42 | 385/123 |
| 5,629,839 A * | 5/1997 | Woychik | H05K 3/366 | 361/784 |
| 6,040,624 A * | 3/2000 | Chambers | H01L 23/4985 | 257/668 |
| 6,087,500 A * | 7/2000 | Fukuda | C07D 239/47 | 544/320 |
| 6,246,016 B1 * | 6/2001 | Roessler | H01L 23/49805 | 174/261 |
| 6,392,896 B1 * | 5/2002 | Stoller | H05K 1/141 | 361/760 |
| 6,674,648 B2 * | 1/2004 | McCall | G11C 5/04 | 174/261 |
| 6,710,439 B2 * | 3/2004 | Lee | H01L 23/49575 | 257/666 |
| 6,771,515 B2 * | 8/2004 | McCall | G11C 5/063 | 257/723 |
| 6,800,942 B1 * | 10/2004 | Kinsman | H01L 25/0657 | 174/255 |
| 6,867,377 B2 * | 3/2005 | Anderson | G02B 6/266 | 174/254 |
| 7,273,379 B2 * | 9/2007 | Jang | H05K 3/366 | 361/803 |
| 7,420,262 B2 * | 9/2008 | Bauer | H01L 21/78 | 257/501 |
| 7,768,280 B1 * | 8/2010 | Wright | G01R 31/2889 | 324/754.03 |
| 7,800,918 B2 * | 9/2010 | Saeki | G06F 13/1684 | 361/760 |
| 8,344,842 B1 * | 1/2013 | Luzanov | H05K 1/141 | 336/192 |
| 8,659,154 B2 | 2/2014 | Meyer et al. | | |
| 8,822,268 B1 | 9/2014 | Magnus | | |
| 8,890,284 B2 | 11/2014 | Kilger et al. | | |
| 8,941,220 B2 * | 1/2015 | Kim | H01L 23/4334 | 257/676 |
| 8,980,697 B2 | 3/2015 | Yamada et al. | | |
| 9,475,694 B2 * | 10/2016 | Martizon, Jr. | B81C 3/008 | |
| 2005/0018977 A1 | 1/2005 | Beer et al. | | |
| 2009/0160053 A1 * | 6/2009 | Meyer | H01L 21/568 | 257/738 |
| 2009/0184410 A1 * | 7/2009 | Park | H01L 23/49531 | 257/690 |
| 2010/0127386 A1 * | 5/2010 | Meyer-Berg | H01L 21/565 | 257/698 |
| 2011/0074536 A1 * | 3/2011 | Coffy | H01L 21/568 | 336/200 |
| 2012/0106112 A1 * | 5/2012 | Knies | H01L 24/97 | 361/783 |
| 2012/0286415 A1 * | 11/2012 | Sakai | H01L 24/97 | 257/734 |
| 2012/0319260 A1 * | 12/2012 | Kim | H01L 23/4334 | 257/676 |
| 2014/0069783 A1 * | 3/2014 | Rofougaran | H01H 29/06 | 200/233 |
| 2014/0110840 A1 | 4/2014 | Wojnowski et al. | | |
| 2015/0028448 A1 | 1/2015 | Hosseini et al. | | |
| 2015/0076700 A1 | 3/2015 | Yap | | |
| 2015/0380392 A1 * | 12/2015 | Pang | H01L 21/56 | 257/777 |
| 2015/0382463 A1 * | 12/2015 | Kim | H01L 23/49822 | 361/767 |
| 2017/0012030 A1 * | 1/2017 | Wang | H01L 25/162 | |

* cited by examiner

SYSTEM, APPARATUS, AND METHOD FOR EMBEDDING A 3D COMPONENT WITH AN INTERCONNECT STRUCTURE

CLAIM OF PRIORITY UNDER 35 U.S.C. § 119

The present application for patent claims priority to Provisional Application No. 62/165,820 entitled "SYSTEM, APPARATUS, AND METHOD FOR EMBEDDING A 3D COMPONENT WITH AN INTERCONNECT STRUCTURE" filed May 22, 2015, and assigned to the assignee hereof and hereby expressly incorporated by reference herein.

FIELD OF DISCLOSURE

This disclosure relates generally to packages and more specifically, but not exclusively, to fan out wafer level packages.

BACKGROUND

Face-up packages are fabricated with the active surface of the die facing upward relative to the work piece carrier during molding and post mold grind before formation of the RDL. Face-down packages are fabricated with the active surface of the die facing down relative to the work piece carrier during molding before formation of the RDL. The carrier possesses a temporary adhesive layer that serves keep the die/components at the desired location during molding. After RDL processing, the work piece is ground from the backside of the package/die to the final thickness. Using a thick die and work piece helps prevent die damage during placement, can reduce die movement during molding, and reduces the risk of work piece damage and yield loss during RDL processing. In some FOWLPs, additional passive components may be added to the package proximate to the die. When passive components are added to the package, the manufacturing process increases in complexity due to the requirement for additional operations at pick and place as well as formation of RDL connections to couple the passive component to the RDL and the die. This increases complexity increases costs and the risk of yield loss.

Accordingly, there is a need for systems, apparatus, and methods that allow face up and face down FOWLP manufacturing with additional components that does not increase the complexity of interconnections or the potential for yield loss including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below. For purposes of illustration, examples of inventive concept are shown with respect to a fan out wafer level package ("FOWLP") where the die is face up. However, those skilled in the art should recognize that the aspects may be directed towards any type of FOWLP include face down configurations.

In one aspect, a package includes: a die with an active side; a structure comprising a substrate, interconnects, and a first component coupled to the interconnects, the substrate oriented at an angle greater than 10 degrees relative to a face of the die; a mold compound configured to at least partially cover the die; and a redistribution layer coupled to the active side of the die, the redistribution layer configured to couple the die to the interconnects.

In another aspect, a package includes: a die with an active side and a non-active side opposite the active side; a structure comprising a substrate, interconnects, and a first component coupled to the interconnects, the substrate oriented at an angle greater than 10 degrees relative to a face of the die; a mold compound configured to at least partially cover the die; a first redistribution layer coupled to the active side of the die, the first redistribution layer configured to couple the die to the interconnects; and a second redistribution layer coupled to the interconnects.

In still another aspect, a method for manufacturing a package includes: placing a die on a carrier; placing a structure on the carrier, the structure having a substrate with interconnects and a first component coupled to the interconnects, wherein placing the structure further comprises orienting the substrate at an angle greater than 10 degrees relative to a face of the die; applying a mold compound on the carrier at least partially covering the die; and forming a redistribution layer coupling the die to the interconnects.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein address the industry needs, as well as other previously unidentified needs, and mitigate shortcomings of the conventional methods, apparatus, and systems. For example, a package may include a face up die near a structure having a substrate with interconnects and a first component coupled to the interconnects. The package may include a first redistribution layer coupling the die to the interconnects of the structure.

Figure 1A:
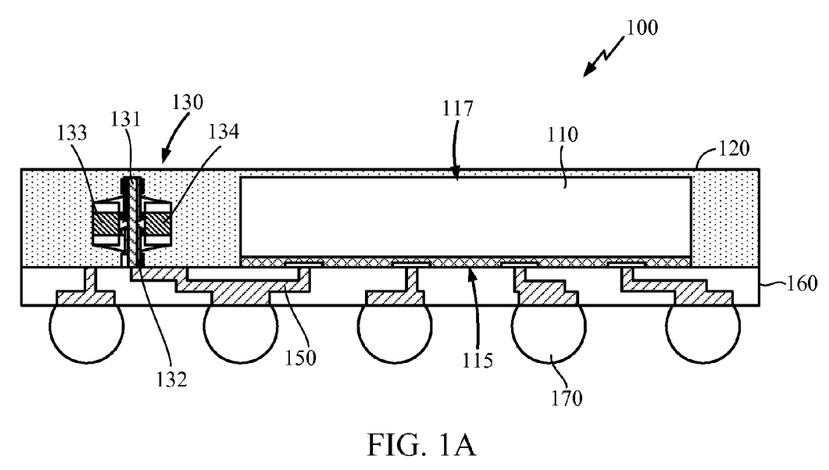
FIG. 1A illustrates an exemplary package with a die in a face up configuration and coupled to interconnects in accordance with some examples of the disclosure.

FIG. 1A illustrates an exemplary package with a die in a face up configuration and coupled to interconnects in accordance with some examples of the disclosure. A face up configuration is where an active side of a die (the active side is the part of the die that contains the active components of the die, such as transistors, resistors, capacitors etc., that perform the operation or function of the die) is facing upward or away from a supporting substrate. As shown in FIG. 1A, a package 100 may include a die 110 having an active side 115 and a non-active side 117; a dielectric layer 160 near the active side 115 and at least partially surrounding a redistribution layer 150; the redistribution layer 150 coupled to the interconnects 132 and the die 110. The package 100 may also include a structure 130, the structure having a substrate 131 with interconnects 132, and a first component 133 coupled to the substrate 131 and coupled to the interconnects 132, a second component 134 coupled to the substrate 131 opposite the first component 133 and coupled to the interconnects 132; a mold compound 120 at least partially covering the die 110 and the structure 130. The package may also have a plurality of solder balls 170 coupled to the redistribution layer 150 for external connections. While the interconnects 132 are depicted as on the substrate 131, it should be understood that these may be embedded in the substrate 131 or other material in the structure 130. The substrate 131 may be composed of glass fiber or mold material and may include one of a lead frame, a printed circuit board, or similar support material and structures. The substrate 131 may be oriented perpendicular to an orientation of the die 110 or at an angle greater than 10 degrees relative to a face of the die (such as the active side or the non-active side). For example, if the die 110 is oriented with the active side 115 facing down, the substrate 131, and the first component may be oriented perpendicular or ninety degrees to the orientation of the die 110 at an angle greater than 10 degrees relative to a face of the die.

The substrate 131 extends upward from and perpendicular to the dielectric layer 160 partially through the mold compound 120 (alternatively, the substrate 131 may be oriented at an angle greater than 10 degrees relative to dielectric layer 160). As shown, the mold compound 120 at least partially covers the non-active side 117 of the die 110 and may cover at least a portion of the active-side of the die (e.g. sidewalls of 115). A portion of the substrate 131 in contact with the dielectric layer 160 may be co-planar with the active side 115 of the die 110. The redistribution layer 150 may be coupled to the die 110 and the interconnects 132 providing an electrical pathway for signals between the die 110 and the structure (e.g. the first component 133 as well as the second component 134). The die 110 may be a logic die or similar integrated circuit component, and the first component 133 and the second component 134 may be a logic die, a memory, or a passive component, such as a capacitor, inductor, or transformer. As shown, the structure 130 includes two components, but it should be understood that the structure 130 may include a single component or more than two components.

Figure 1B:
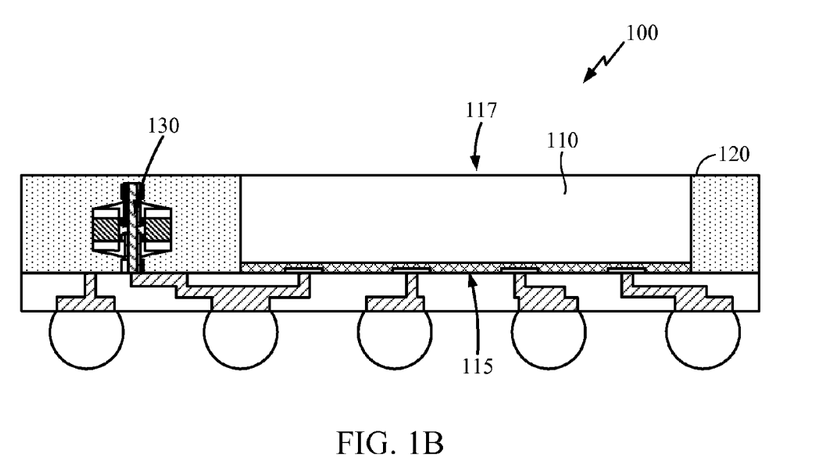
FIG. 1B illustrates an exemplary package coupled to interconnects with an exposed non-active side of the die in accordance with some examples of the disclosure.

FIG. 1B illustrates an exemplary package with a die coupled to interconnects and having an exposed non-active side of the die in accordance with some examples of the disclosure. As shown in FIG. 1B, a package 100 may include a die 110 having an active side 115 and a non-active side 117; a structure 130; and a mold compound 120 at least partially covering the die 110 and the structure 130 such that the non-active side 117 of the die 110 is exposed but not the structure 130. This will allow grinding of the non-active side 117 of the die 110 while preventing contamination of the die due to potential co-grinding of the metal in the structure 130.

Figure 1C:
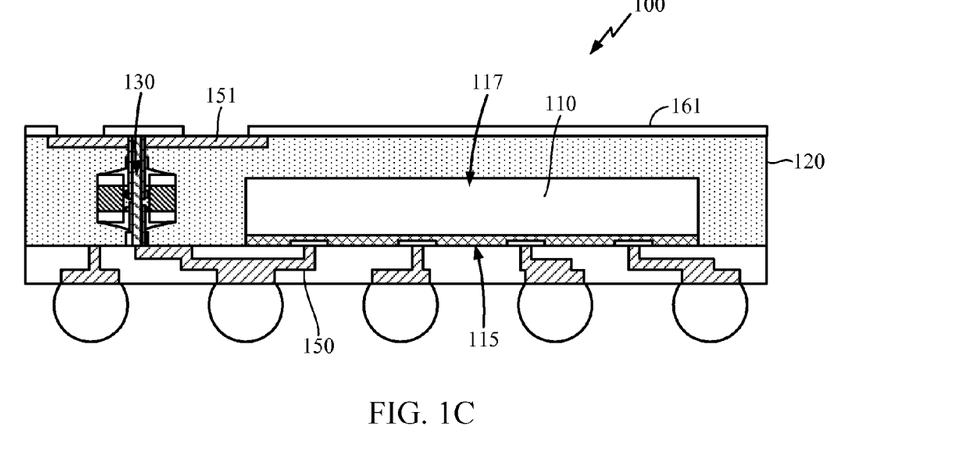
FIG. 1C illustrates an exemplary package with a nearby structure coupled between a first RDL proximate the active side of the die and a second RDL proximate the non-active side of the die in accordance with some examples of the disclosure.

FIG. 1C illustrates an exemplary package with a structure coupled between a first RDL proximate the active side of the die and a second RDL proximate the non-active side of the die in accordance with some examples of the disclosure. As shown in FIG. 1C, a package 100 may include a die 110 having an active side 115 and a non-active side 117; a structure 130; a mold compound 120 at least partially covering the die 110 and the structure 130; a redistribution layer 150 coupling the die 110 to the structure 130; and a second redistribution layer 151 coupled to the structure 130. The structure 130 extending between the redistribution layer 150 and the second redistribution layer 151. The second redistribution layer 151 may allow additional connections to package 100, such as a top package (not shown) in a package on package configuration, additional components, and additional interconnects like external connections. The package 100 may also include a second dielectric layer 161 at least partially surrounding the second redistribution layer 151.

Figure 1D:
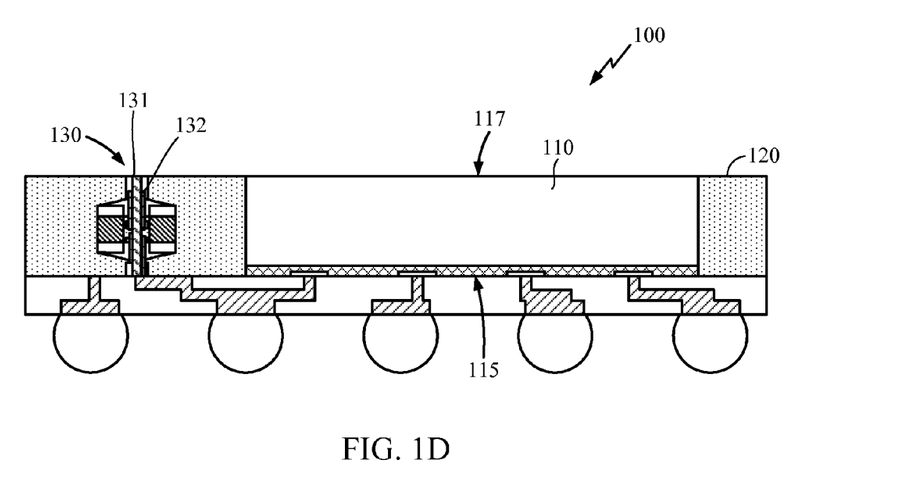
FIG. 1D illustrates an exemplary package with a structure having a substrate extending from a first side of a mold compound to a second side of the mold compound in accordance with some examples of the disclosure.

FIG. 1D illustrates an exemplary package with a structure having a substrate extending from a first side of a mold compound to a second side of the mold compound in accordance with some examples of the disclosure. As shown in FIG. 1D, a package 100 may include a die 110 having an active side 115 and a non-active side 117; a structure 130 and having a substrate 131 with interconnects 132; and a mold compound 120 at least partially covering the die 110 and the structure 130 such that the non-active side 117 of the die 110 is exposed along with a portion of the substrate 131 that does not contain the interconnects 132. This will allow grinding of the non-active side 117 of the die 110 and potentially a portion of the substrate 131 while preventing contamination of the die due to co-grinding of the metal in the interconnects 132. While the die 110 is shown in a face-up orientation, it should be understood that the die 110 may be in a face-down orientation as well.

Figure 2A:
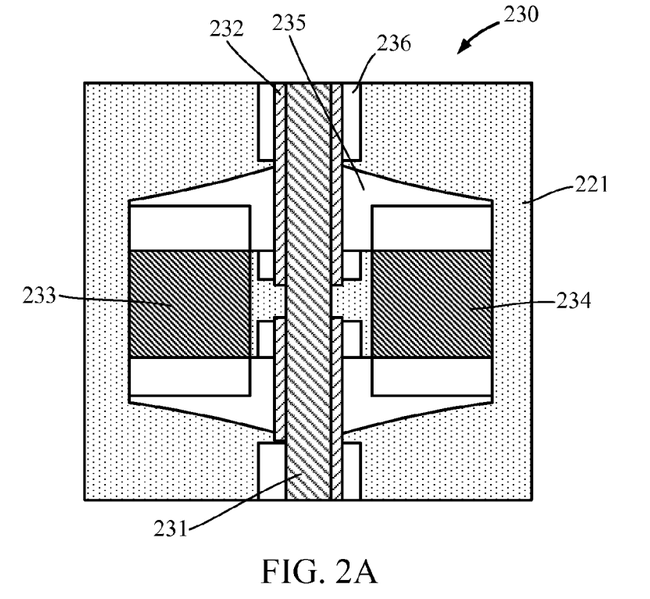
FIG. 2A illustrates a cross section side view of an exemplary structure having a substrate with interconnects, a first component coupled to the interconnects, and a second component coupled to the interconnects in accordance with some examples of the disclosure.

FIG. 2A illustrates a cross section side view of an exemplary structure having a substrate with interconnects, a first component coupled to the interconnects, and a second component coupled to the interconnects in accordance with some examples of the disclosure. As shown in FIG. 2A, a structure 230 may include a substrate 231 with interconnects 232 (e.g. interconnects, bumps, pillars, conductive elements), and a first component 233 coupled to the substrate 231 and coupled to the interconnects 232, a second component 234 coupled to the substrate 231 opposite the first component 233 and coupled to the interconnects 232. The structure 230 may also include a solder material 235 on each side of the substrate 231 to securely couple the first component 233 and the second component 234 to the substrate 231 and a solder mask 236 (e.g. a dielectric material) that protects the substrate 231 during a solder reflow process, for example. In addition, the structure 230 may include a second mold compound 221 at least partially covering the structure 230. Alternatively, the second mold compound 221 may be provided by a mold compound of a package (e.g. mold compound 120).

Figure 2B:
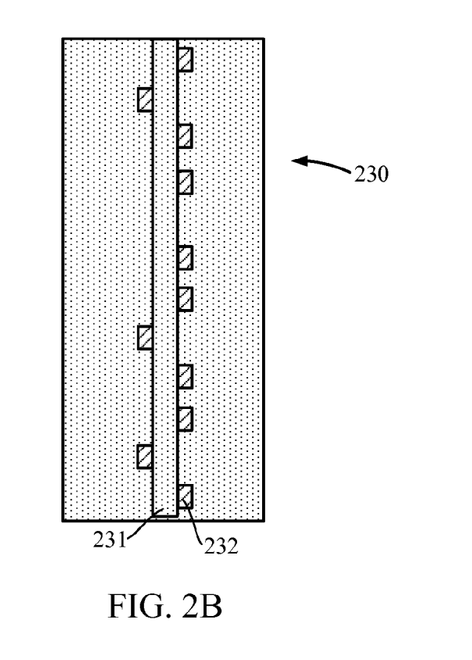
FIG. 2B illustrates a bottom up view of an exemplary a substrate having interconnects in accordance with some examples of the disclosure.

FIG. 2B illustrates a bottom up view of an exemplary a substrate having interconnects in accordance with some examples of the disclosure. As shown in FIG. 2B, a structure 230 may include a substrate 231 with interconnects 232. The bottom of the interconnects 232 may serve as capture pads for coupling the interconnects 232 with a redistribution layer (e.g. redistribution layer 150) or other interconnect structures.

Figure 3A:
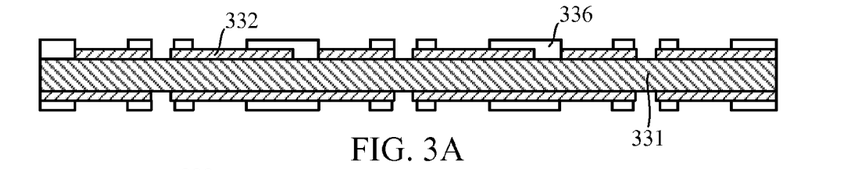
FIGS. 3A-G illustrate an exemplary method for manufacturing a package with a face down die coupled to a structure in accordance with some examples of the disclosure.
Figure 3B:
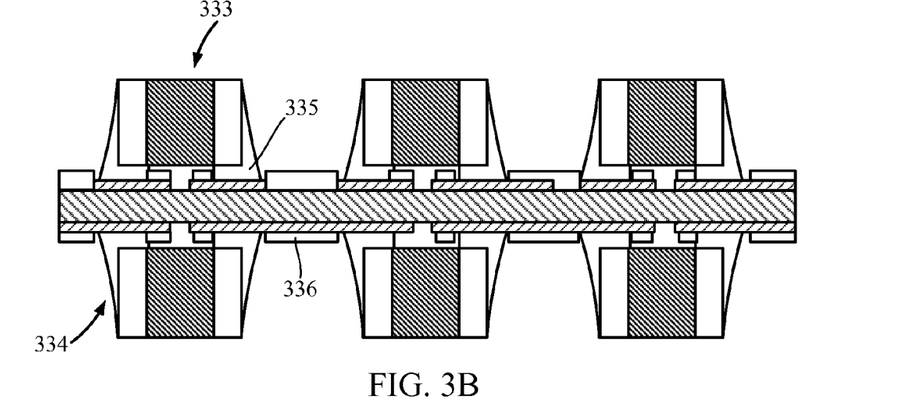
Figure 3C:
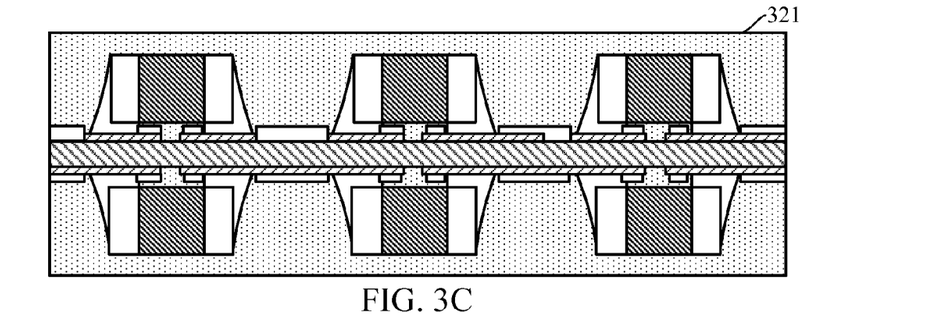
Figure 3D:
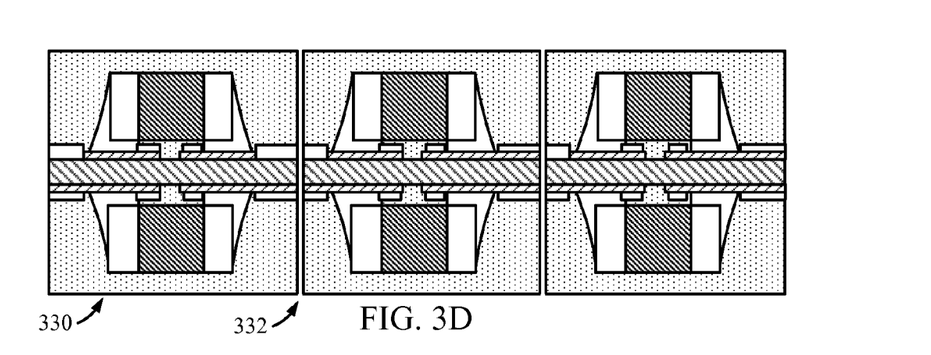

FIGS. 3A-G illustrate an exemplary method for manufacturing a package 300 with a face down die coupled to a structure in accordance with some examples of the disclosure. While the figures show manufacturing multiple packages 300 at the same time, it should be understood that the process described may be used to manufacture a single package 300. As shown in FIG. 3A, the partial process flow begins with the formation of a plurality of structures 330 starting with a substrate 331. Interconnects 332 are formed on (or embedded in) the substrate 331 followed by the application of a solder mask 336 (e.g. a dielectric material). As shown in FIG. 3B, a plurality of first components 333 and a plurality of second components 334 are securely coupled to the substrate 331 using a solder material 335. This may be accomplished using surface mount technology or similar techniques. As shown in FIG. 3C, a second mold compound 321 is applied to at least partially cover the structure. Next in FIG. 3D, the plurality of structures 330 are singulated along lines 322 with a saw, for example, to create individual structures 330 with flat sidewalls. The flat side walls will aid in further processing of the structure 330.

Figure 3E:
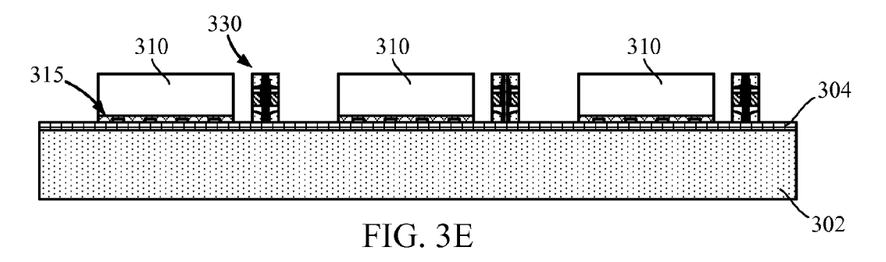
Figure 3F:
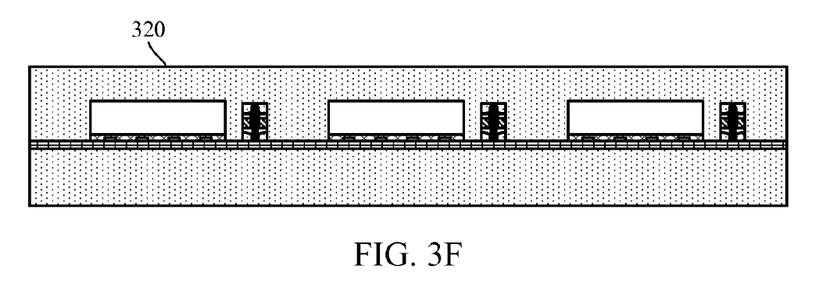
Figure 3G:
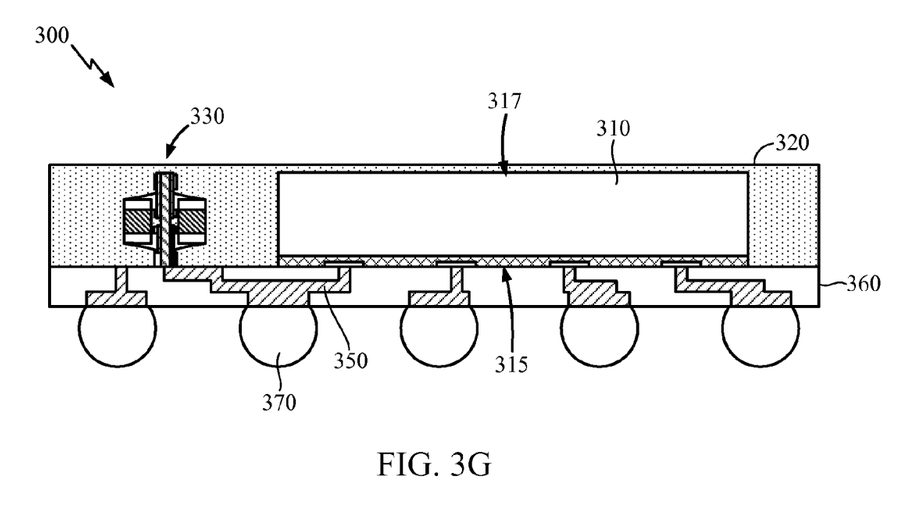

As shown in FIG. 3E, the process continues with the provision of a carrier 302. An adhesive layer 304 is applied to the carrier 302 followed by the placement a plurality of die 310 and a plurality of structures 330 on the adhesive layer 304 with one structure 330 proximate to each die 310. Each die 310 is place in a face down orientation with an active side 315 of the die 310 on the adhesive layer 304. Alternatively, the process may be used on die placed face up, molded, ground, carrier removed, and then having an RDL added (see, for example, FIGS. 4A-G). While the structures 330 are shown in FIG. 3E as including a mold compound, it should be understood that the mold compound is optional. As shown in FIG. 3F, a mold compound 320 is applied on top of the adhesive layer 304 to at least partially cover the plurality of die 310 and the plurality of structures 330. As shown in FIG. 3G, a portion of the mold compound 320 is removed such that a non-active side 317 of each die 310 and each structure 330 is still at least partially covered by the mold compound 320. This will allow subsequent backside grinding without grinding the plurality of structures 330 and potentially damaging any component on the plurality of structures 330 while avoiding metallic contamination of the silicon in the plurality of die 310.

While only the end result shown in FIG. 3G and not each action, the partial process continues with the removal of the carrier 302 and adhesive layer 304 followed by the application of a dielectric layer 360. Next, a RDL layer 350 is formed and coupled to the die 310 and the interconnects 332. The RDL layer 350 may be at least partially surrounded by the dielectric layer 360 or formed between the dielectric layer 360 and the active side 315 of the die 310 and the dielectric layer 360. The RDL layer 350 provides electrical pathways that couple, for example, the die 310 to the structure 330 along with external connections, such as solder balls 370. After formation of the RDL 350 and the dielectric layer 360, a plurality of solder balls 370 may be formed and coupled to the RDL 350 to provide external connections, such as to a printed circuit board or another package in a package on package structure. Lastly, the work piece can then be singulated with a saw, for example, to form individual packages 300 with a face down die.

Figures 4A, 4B:
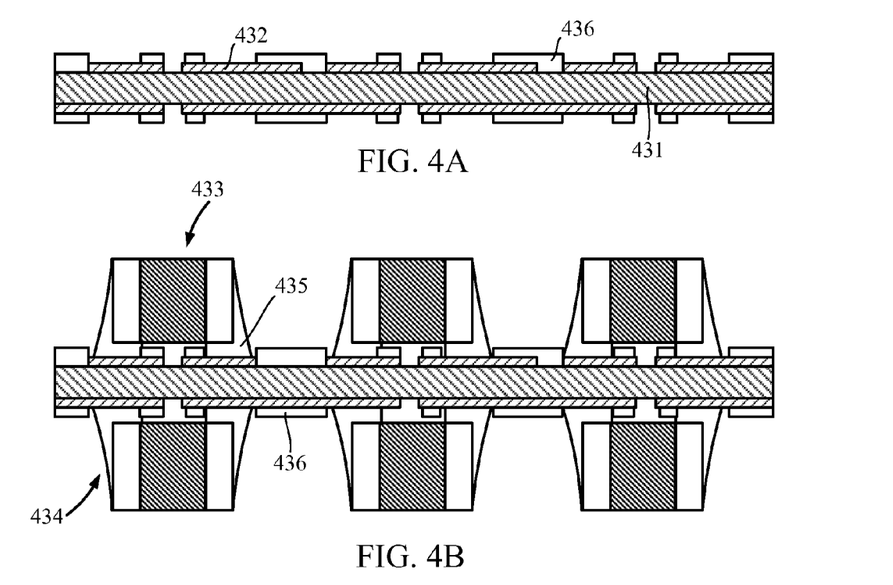
FIGS. 4A-G illustrate an exemplary method for manufacturing a package with a face up die coupled to a structure in accordance with some examples of the disclosure.
Figure 4C:
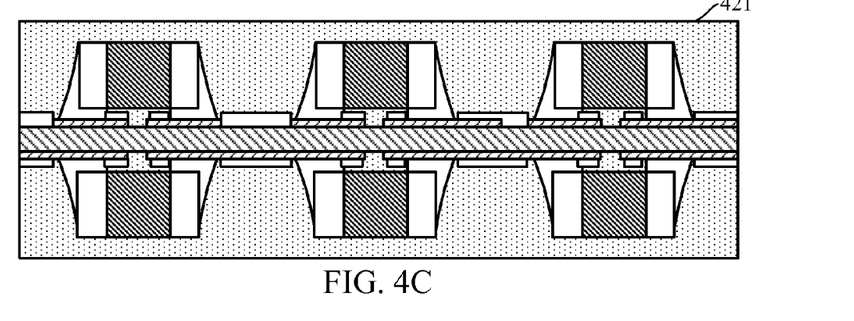
Figure 4D:
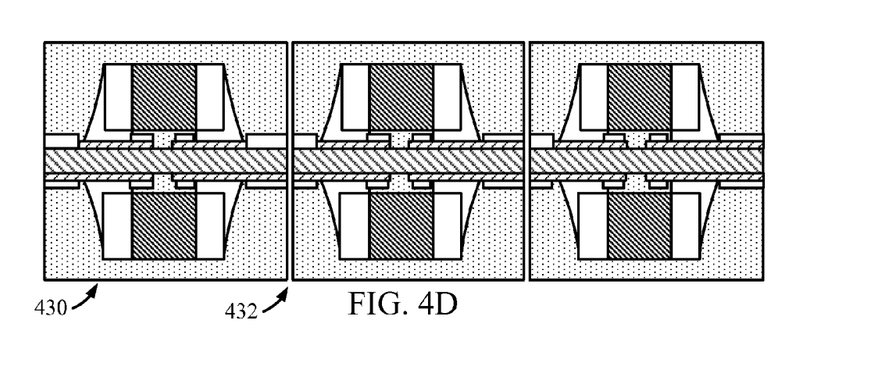

FIGS. 4A-G illustrate an exemplary method for manufacturing a package 400 with a face up die coupled to a structure in accordance with some examples of the disclosure. While the figures show manufacturing multiple packages 400 at the same time, it should be understood that the process described may be used to manufacture a single package 400. As shown in FIG. 4A, the partial process flow begins with the formation of a plurality of structures 430 starting with a substrate 431. Interconnects 432 are formed on (or embedded in) the substrate 431 followed by the application of a solder mask 436 (e.g. a dielectric material). As shown in FIG. 4B, a plurality of first components 433 and a plurality of second components 434 are securely coupled to the substrate 431 using a solder material 435. This may be accomplished using surface mount technology or similar techniques. As shown in FIG. 4C, a second mold compound 421 is applied to at least partially cover the structure. Next in FIG. 4D, the plurality of structures 430 are singulated along lines 422 with a saw, for example, to create individual structures 430 with flat sidewalls. The flat side walls will aid in further processing of the structure 430.

Figure 4E:
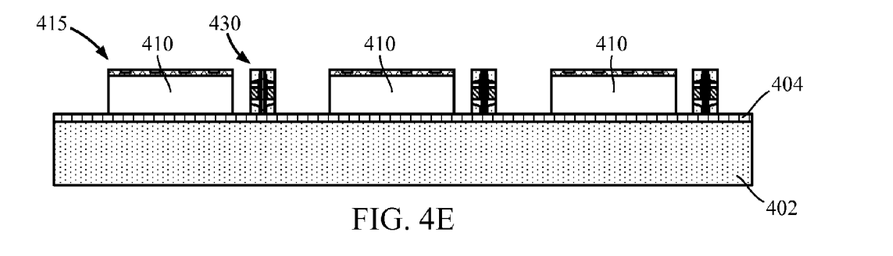
Figure 4F:
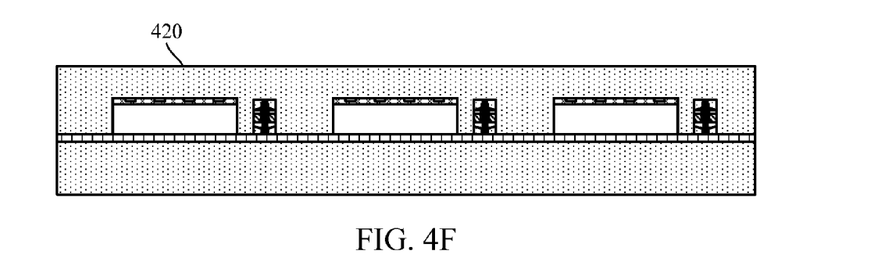
Figure 4G:
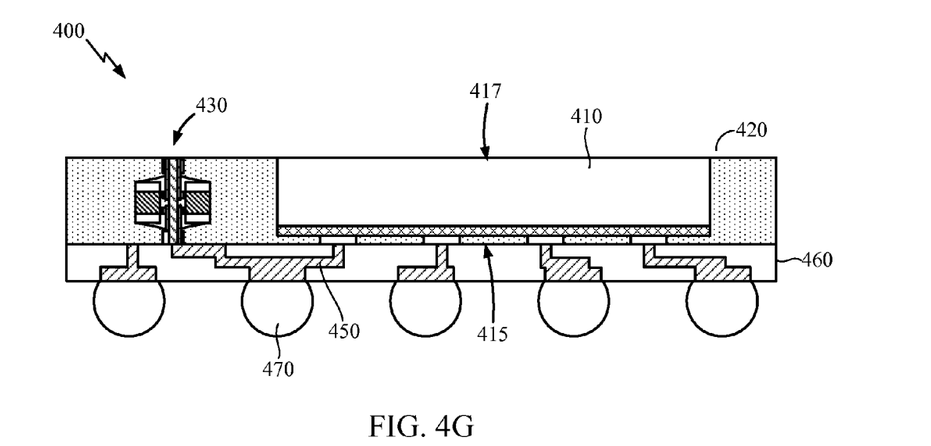

As shown in FIG. 4E, the process continues with the provision of a carrier 402. An adhesive layer 404 (e.g. an adhesive tape or paste) is applied to the carrier 402 followed by the placement a plurality of die 410 and a plurality of structures 430 on the adhesive layer 404 with one structure 430 proximate to each die 410. Each die 410 is place in a face up orientation with an active side 415 of the die 410 facing upward away from the carrier 402. Alternatively, the process may be used on die placed face down, molded, ground, carrier removed, and then having an RDL added (see, for example, FIGS. 3A-G). While the structures 430 are shown in FIG. 4E as including a mold compound, it should be understood that the mold compound is optional. As shown in FIG. 4F, a mold compound 420 is applied on top of the adhesive layer 404 to at least partially cover the plurality of die 410 and the plurality of structures 430. As shown in FIG. 4G, a portion of the mold compound 420 is removed such that the active side 415 of each die 410 and interconnects 432 of each structure 430 are at least partially exposed.

While only the end result shown in FIG. 4G and not each action, the partial process continues with the removal of the carrier 402 and adhesive layer 404, the structure is flipped to re-orient the active side facing downward followed by the application of a dielectric layer 460. Next, a RDL layer 450 is formed and coupled to the die 410 and the interconnects 432. The RDL layer 450 may be at least partially surrounded by the dielectric layer 460 or formed between the dielectric layer 460 and the active side 415 of the die 410 and the dielectric layer 460. The RDL layer 450 provides electrical pathways that couple, for example, the die 410 to the structure 430 along with external connections, such as solder balls 470. After formation of the RDL 450 and the dielectric layer 460, a plurality of solder balls 470 may be formed and coupled to the RDL 450 to provide external connections, such as to a printed circuit board or another package in a package on package structure. Lastly, the work piece can then be singulated with a saw, for example, to form individual packages 400 with a face up die.

Figure 5:
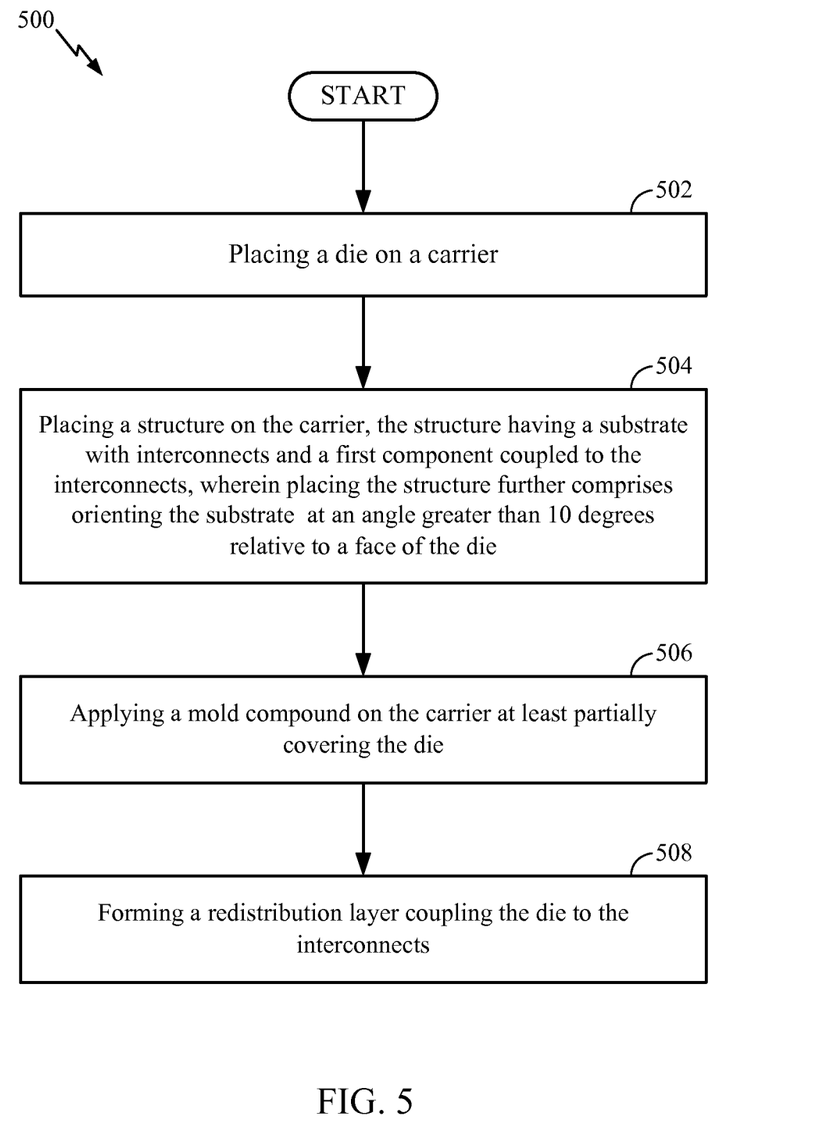
FIG. 5 illustrates an exemplary method for manufacturing a package with a die coupled to a structure in accordance with some examples of the disclosure.

FIG. 5 illustrates an exemplary method for manufacturing a package with a face up or face down die coupled to a structure in accordance with some examples of the disclosure. As shown in block 502, the method begins with placing a die on a carrier, the die having an active side facing the carrier as shown or the die may be placed with a non-active side facing the carrier. In block 504, the method continues with placing a structure, the structure having a substrate with interconnects and a first component coupled to the interconnects. Followed by applying a mold compound on the carrier at least partially covering the die and the structure in block 506. Then grinding to expose the die if the die was placed face-up and removal of the tape and carrier before RDL formation. In block 508, the method concludes with forming a redistribution layer, the redistribution layer coupling the die to the interconnects.

In this description, certain terminology is used to describe certain features. The term "mobile device" can describe, and is not limited to, a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, an automotive device in an automotive vehicle, and/or other types of portable electronic devices that can be carried by a person and/or having communication capabilities (e.g., wireless, cellular, infrared, short-range radio, etc.). Further, the terms "user equipment" (UE), "mobile terminal," "mobile device," and "wireless device," can be interchangeable.

Figure 6:
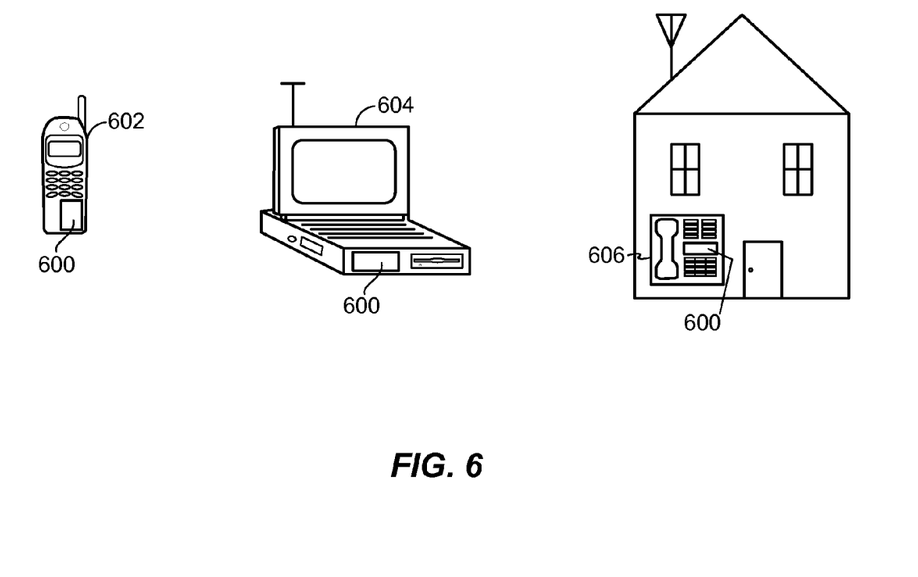
FIG. 6 illustrates various electronic devices that may be integrated with any of the packages described herein in accordance with some examples of the disclosure.

Packages according to the examples above (e.g. the package 100, the package 300, and the package 400) can be used for a number of different applications, such as integrated into various electronic devices examples of which are shown in FIG. 6. FIG. 6 illustrates various electronic devices that may be integrated with any of the aforementioned packages (e.g. the package 100, the package 300, and the package 400). For example, a mobile phone device 602, a laptop computer device 604, and a fixed location terminal device 606 may include an integrated device 600 as described herein. The integrated device 600 may be, for example, any of packages described herein. The devices 602, 604, 606 illustrated in FIG. 6 are merely exemplary. Other electronic devices may also feature the integrated device 600 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof. The wireless communication between the various electronic devices and the RAN can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE) or other protocols that may be used in a wireless communications network or a data communications network.

The word "exemplary" is used herein to mean "serving as an example, instance, or illustration." Any details described herein as "exemplary" is not necessarily to be construed as preferred or advantageous over other examples. Likewise, the term "examples" does not require that all examples include the discussed feature, advantage or mode of operation. Use of the terms "in one example," "an example," "in one feature," and/or "a feature" in this specification does not necessarily refer to the same feature and/or example. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples only and is not intended to be limiting of examples of the disclosure. As used herein, the singular forms "a," "an," and "the" are intended to include the plural forms as well, unless the context clearly indicates otherwise. It will be further understood that the terms "comprises", "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Thus, a reference to first and second elements does not mean that only two elements can be employed, or that the first element must necessarily precede the second element. Also, unless stated otherwise, a set of elements can comprise one or more elements.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples require more features than are explicitly mentioned in the respective claim. Rather, the situation is such that inventive content may reside in fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A package comprising:
    a die with an active side and a backside;
    a structure comprising a substrate, interconnects, and a first component coupled to the interconnects, the substrate oriented at an angle greater than 10 degrees relative to a face of the die, the structure proximate to the die such that a portion of the structure is between the active side and the backside and the structure does not extend past the active side of the die;
    a mold compound configured to at least partially cover the die; and
    a redistribution layer coupled to the active side of the die, the redistribution layer configured to couple the die to the interconnects, and wherein the substrate is in direct contact with the redistribution layer and extends from the redistribution layer through at least a portion of the mold compound.

2. The package of claim 1, wherein the structure further comprises a second component, the second component coupled to the interconnects.

3. The package of claim 1, wherein the redistribution layer is coupled to the structure.

4. The package of claim 3, wherein a dielectric layer at least partially surrounds the redistribution layer.

5. The package of claim 3, further comprising a plurality of solder balls coupled to the redistribution layer.

6. The package of claim 1, wherein the substrate extends from the redistribution layer partially through the mold compound.

7. The package of claim 1, wherein the substrate extends from the redistribution layer through the mold compound and the die has an exposed non-active side opposite the active side.

8. The package of claim 1, wherein the first component is one of a logic die, a memory, a capacitor, an inductor, or a transformer.

9. The package of claim 1, wherein the substrate includes one of a leadframe, an interposer or a printed circuit board, and the substrate is oriented at an angle of approximately 90 degrees relative to the face of the die.

10. The package of claim 1, wherein the package is incorporated into a device selected from a group comprising of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and an automotive device in an automotive vehicle, and further includes the device.

* * * * *